United States Patent
Crouch

(10) Patent No.: US 6,514,569 B1
(45) Date of Patent: Feb. 4, 2003

(54) VARIABLE VOLUME POSITIVE DISPLACEMENT DISPENSING SYSTEM AND METHOD

(76) Inventor: Kenneth Crouch, 31 Moody St., North Andover, MA (US) 01845

( * ) Notice: Subject to any disclaimer, the term of this patent is extended or adjusted under 35 U.S.C. 154(b) by 0 days.

(21) Appl. No.: 09/483,360

(22) Filed: Jan. 14, 2000

(51) Int. Cl.[7] ............................................... B05D 1/02
(52) U.S. Cl. ................... 427/421; 417/512; 417/517; 417/519; 222/134
(58) Field of Search ......................... 417/512, 517, 417/519; 222/134; 427/421

(56) References Cited

U.S. PATENT DOCUMENTS

| | | | |
|---|---|---|---|
| 1,842,569 A | 1/1932 | Richer | |
| 2,969,810 A | 1/1961 | Dudley | 137/625.15 |
| 3,982,663 A | 9/1976 | Larkin | 222/1 |
| 4,907,950 A | 3/1990 | Pierrat | 417/271 |
| 5,004,404 A | 4/1991 | Pierrat | 917/513 |
| 5,718,570 A * | 2/1998 | Beckett et al. | 417/517 |
| 5,992,688 A * | 11/1999 | Lewis et al. | 222/1 |

FOREIGN PATENT DOCUMENTS

| | | |
|---|---|---|
| CH | 129795 | 1/1929 |
| DE | 515359 | 1/1931 |
| WO | WO96/29515 | 9/1996 |

* cited by examiner

Primary Examiner—Katherine A. Bareford
(74) Attorney, Agent, or Firm—Mintz, Levin, Cohn, Ferris, Glovsky & Popeo

(57) ABSTRACT

Aspects of the present invention are directed to methods and apparatus for dispensing material onto substrates. A dispensing system is provided for dispensing a metered quantity of dispensing material onto a substrate. The dispensing system includes a dispensing pump, a container, coupled to the dispensing pump, to contain the material prior to dispensing, and a computer control system to control operation of the dispensing pump. The dispensing pump includes an inlet that receives material from the container, an outlet from which material is dispensed, a plurality of dispensing chambers each chamber having a piston movable within the chamber, a valve, positionable to selectively couple the dispensing chambers to the inlet and the outlet, a drive cam, coupled to the pistons, to control movement of the pistons within the chambers to draw dispensing material into the chambers and to dispense dispensing material from the chambers, and a motor coupled to the computer control system and to the drive cam to provide movement of the drive cam to cause dispensing material to dispense from the dispensing pump.

10 Claims, 9 Drawing Sheets

VARIABLE VOLUME POSITIVE DISPLACEMENT DISPENSING SYSTEM AND METHOD

FIELD OF THE INVENTION

The present invention relates generally to a method and apparatus for dispensing material onto a substrate, and more specifically, to variable volume positive displacement systems and methods.

BACKGROUND OF THE INVENTION

There are several types of prior art dispensing systems used for dispensing metered amounts of liquid or paste for a variety of applications. One such application is in the assembly of printed circuit boards and integrated circuit chips. In this application, dispensing systems are used in the process of encapsulating integrated circuits with an encapsulating material and in the process of underfilling flip integrated circuit chips with an encapsulent. Prior art dispensing systems are also used for dispensing dots or balls of liquid epoxy or solder onto circuit boards and integrated circuits. The liquid epoxy and solder is used to connect components to a circuit board or to an integrated circuit. The dispensing systems described above include those manufactured and distributed by Speedline Technologies, Inc, the assignee of the present invention.

A It is desirable to use positive displacement pumps in dispensing systems to effectively control the volume of material dispensed. U.S. Pat. Nos. 4,907,950 and 5,004,404 to Pierrat, which are incorporated herein by reference, disclose positive displacement pumps used to dispense variable quantities of material. The pumps disclosed by Pierrat include a crank-shaft drive that drives a number of pistons and cylinders to couple pressurized material at an inlet of the pump to an outlet of the pump to dispense the material. The pumps disclosed by Pierrat have up to four cylinders, each of which has an inlet port and an outlet port that are respectively coupled on a time-shared basis to the inlet and the outlet of the pump to provide dispensing.

Several problems may be encountered with the type of pump disclosed by Pierrat and other pumps of the prior art. First, the use of numerous pistons and inlet ports can result in a complex design that may have less reliability than desired. Second, such a complex design may result in a pump that is difficult to clean. In many dispensing applications, it is necessary, or at least desirable, to periodically dismantle the dispensing pump to clean material that may become trapped in the pump. Further, the complexity of prior art pumps often times causes them to be more expensive to manufacture than desired, resulting in them being prohibitively expensive for some dispensing applications.

Based on the above, it is desirable to provide a variable volume positive displacement pump that is simpler in design, more reliable and less expensive than dispensing pumps of the prior art.

SUMMARY OF THE INVENTION

A first aspect of the present invention is directed to a dispensing system for dispensing a metered quantity of material onto a substrate. The dispensing system includes a base upon which the substrate is placed for receiving dispensed material, a dispensing pump that dispenses material onto the substrate, a container to contain the material prior to dispensing, and a computer control system, coupled to the dispensing pump to control operation of the dispensing pump. The dispensing pump includes an inlet coupled to the container to receive material from the container, an outlet from which material is dispensed, a plurality of dispensing chambers each chamber having a piston movable within the chamber, a valve, positionable to selectively couple the dispensing chambers to the inlet and the outlet, a drive cam, coupled to the pistons, to control movement of the pistons within the chambers to draw dispensing material into the chambers and to dispense dispensing material from the chambers, and a motor coupled to the computer control system and to the drive cam to provide movement of the drive cam to cause dispensing material to dispense from the dispensing pump.

The drive cam may be constructed and arranged to move each of the pistons to an extended position and to maintain each of the pistons at the extended position for a first predetermined dwell time. The drive cam may also be constructed and arranged to move each of the pistons to a retracted position and to maintain each of the pistons at the retracted position for a second predetermined dwell time. The valve may be coupled to the drive cam, such that the drive cam controls operation of the valve. For each of the dispensing chambers, the valve may be positionable between a first position, a second position, and a third position. When the valve is in the first position, the dispensing chamber is operatively coupled to the inlet to receive material from the container, when the valve is in the second position, the dispensing chamber is operatively coupled to the outlet to dispense material, and when the valve is in the third position, the valve blocks the flow of material between the inlet and the dispensing chamber and between the outlet and the dispensing chamber. The drive cam may be constructed and arranged to control the valve such that for each dispensing chamber, the valve moves between the first position and the third position and between the second position and the third position during one of the first predetermined dwell time and the second predetermined dwell time for the piston in the dispensing chamber. The motor may be coupled to the drive cam to provide rotational movement of the drive cam to dispense material, and the drive cam may be coupled to the valve to provide rotational movement of the valve. The dispensing pump may include a detector coupled to the computer control system that detects a home position of the drive cam and provides a signal to the computer control system. The computer control system may include a motor controller for controlling operation of the motor, and a calibration system for obtaining calibration factors for the dispensing pump and providing the calibration factors to the motor controller.

A second aspect of the present invention is directed to a dispensing pump for dispensing a metered quantity of material onto a substrate. The dispensing pump includes an inlet for receiving dispensing material, an outlet from which the dispensing material is dispensed, a plurality of dispensing chambers each having at least one opening to receive material and having at least one opening to dispense material, a circular valve having a first channel and a second channel, a motor, operatively coupled to the circular valve to provide rotation of the circular valve to at least a first rotational position and a second rotational position, such that in the first rotational position of the circular valve, the first channel of the circular valve is operatively coupled between the inlet and one of the dispensing chambers to provide material to the one of the dispensing chambers, and in the second rotational position of the circular valve, the second channel of the circular valve is operatively coupled between the outlet and the one of the dispensing chambers.

The dispensing pump may include a drive cam operatively coupled between the motor and the circular valve. The dispensing pump may include a plurality of pistons, each of the plurality of pistons being disposed in a corresponding one of the plurality of dispensing chambers, and each of the plurality of pistons being coupled to the drive cam.

A third aspect of the present invention is directed to a method of dispensing material onto a substrate using a dispensing system having a dispensing pump, the dispensing pump having a plurality of dispensing chambers each having a piston movable within the dispensing chamber to draw the dispensing material into the dispensing chamber and to dispense the material from the dispensing chamber. The method includes steps of loading the substrate into the dispensing system, positioning the dispensing pump over the substrate, moving one of the pistons in one of the dispensing chambers in a first direction to a retracted position to draw material into the one of the dispensing chambers, maintaining the piston at the retracted position for a first predetermined dwell time, and moving the one of the pistons in a second direction, opposite the first direction, to dispense the material from the one of the dispensing chambers.

The dispensing pump may include an inlet to receive material, an outlet from which material is dispensed, and a valve controllable between a first open position and a first closed position, such that in the first open position, the valve operatively couples the inlet to the one of the dispensing chambers to enable material to flow from the inlet to the one of the dispensing chambers, and in the first closed position the valve prevents material flow from the inlet to the one of the dispensing chambers, and wherein the method further includes a step of moving the valve from the first open position to the first closed position during the first predetermined dwell time.

The method of the third aspect of the present invention may further include steps of moving the piston in the one of the dispensing chambers in the second direction to an extended position to dispense material, maintaining the one of the pistons at the extended position for a second predetermined dwell time, and moving the piston in the first direction to draw material into the one of the dispensing chambers. The valve may be controllable between a second open position and a second closed position such that in the second open position, the valve operatively couples the one of the dispensing chambers to the outlet to enable material to flow from the one of the dispensing chambers to the outlet, and in the second closed position the valve prevents material flow from the one of the dispensing chambers to the outlet, and the method may further include a step of moving the valve from the second open position to the second closed position during the second predetermined dwell time. The method may also include steps of moving the valve from the first closed position to the first open position during the second predetermined dwell time, and moving the valve from the second closed position to the second open position during the first predetermined dwell time.

A fourth aspect of the present invention is directed to a dispensing pump for dispensing material onto a substrate. The dispensing pump includes an inlet to receive dispensing material, an outlet from which dispensing material is dispensed, a chamber housing having a plurality of dispensing chambers each having a piston movable within the dispensing chamber to draw the dispensing material into the dispensing chamber and to dispense the dispensing material from the dispensing chamber, means for moving one of the pistons in one of the dispensing chambers in a first direction to a retracted position to draw material into the one of the dispensing chambers, means for maintaining the one of the pistons at the retracted position for a first predetermined dwell time, and means for moving the one of the pistons in a second direction, opposite the first direction, to dispense the material from the one of the dispensing chambers.

The dispensing pump may further include a valve controllable between a first open position and a first closed position such that in the first open position, the valve operatively couples the inlet to the dispensing chamber to enable material to flow from the inlet to the dispensing chamber, and in the first closed position the valve prevents material flow from the inlet to the dispensing chamber, and means for moving the valve from the first open position to the first closed position during the first predetermined dwell time.

The dispensing pump of the fourth aspect of the present invention may also include means for moving the one of the pistons in the one of the dispensing chambers in the second direction to an extended position to dispense material, and means for maintaining the one of the pistons at the extended position for a second predetermined dwell time. The valve may be controllable between a second open position and a second closed position such that in the second open position, the valve operatively couples the one of the dispensing chambers to the outlet to enable material to flow from the one of the dispensing chambers to the outlet, and in the second closed position the valve prevents material flow from the one of the dispensing chambers to the outlet, and the dispensing pump may further include means for moving the valve from the second open position to the second closed position during the second predetermined dwell time.

BRIEF DESCRIPTION OF THE DRAWINGS

For a better understanding of the present invention, reference is made to the drawings which are incorporated herein by reference and in which.

DETAILED DESCRIPTION

Figure 1:
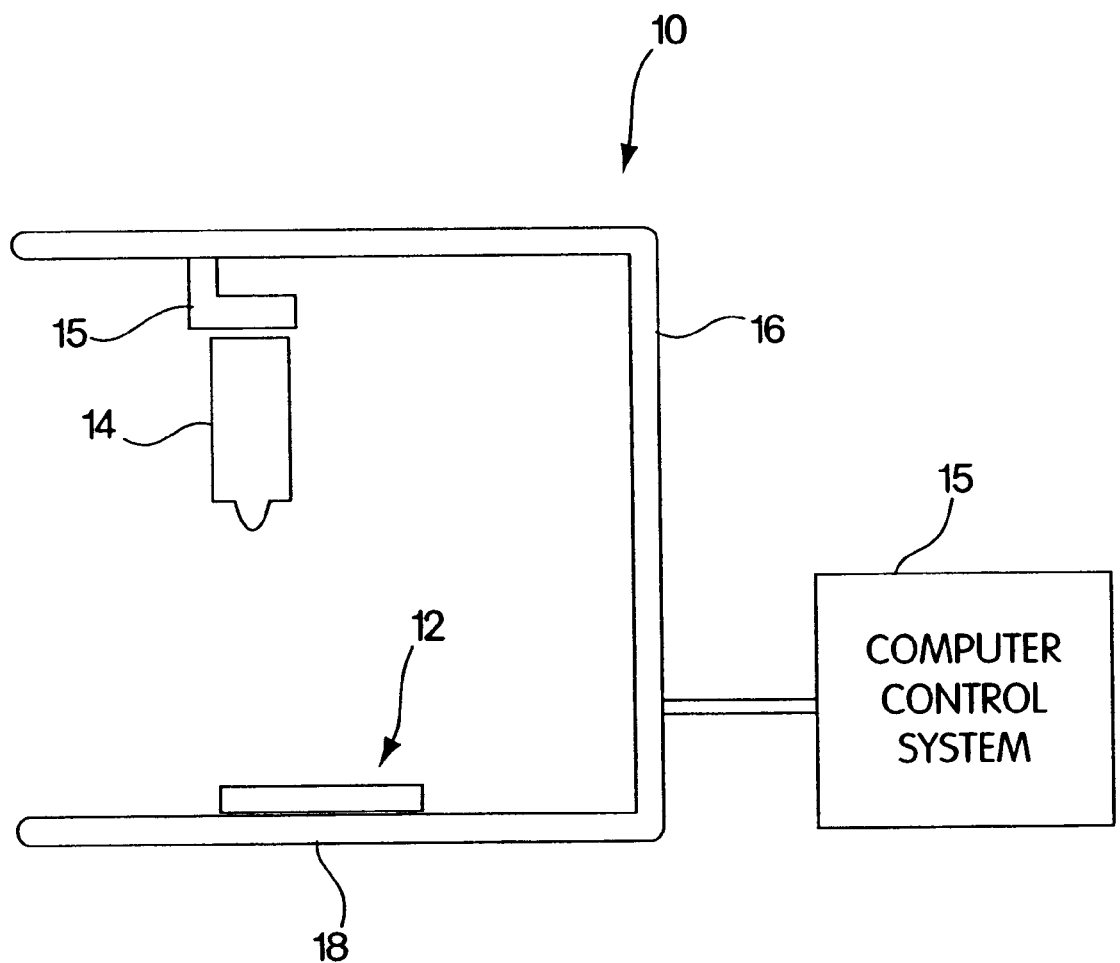
FIG. 1 shows a dispensing system used with embodiments of the present invention.

Embodiments of the present invention are directed to dispensing pumps, methods of dispensing and dispensing systems that contain dispensing pumps of the present invention and/or utilize methods of dispensing of the present invention. FIG. 1 shows a dispensing system 10 used for dispensing a viscous material onto a substrate 12. The dispensing system includes a dispensing pump 14 and a computer control system 15. The dispensing system 100 also includes, an arm 15, and a frame 16 having a base 18 for supporting the substrate. As is known, a conveyor system may be used in the dispensing system to control loading and unloading of substrates. The arm 15 is movably coupled to the dispensing pump and is movably coupled to the frame. The arm can be moved using motors under the control of the computer control system in X, Y, and Z directions to locate the dispensing pump at predetermined locations and heights over the substrate 12.

Embodiments of the present invention provide dispensing pumps that may be used as the dispensing pump 14 in the dispensing system 10, and the present invention also provides methods of dispensing for use with the dispensing system 10. However, embodiments of the present invention are not limited for use with the system shown in FIG. 1 and may be used with other dispensing systems as well, including the XYFLEX™ and CAMALOT™ dispensing systems available from the assignee of the present invention, Speedline Technologies, Inc. of Haverhill, Mass. In addition, embodiments of the present invention may be used with dispensing systems disclosed in U.S. patent application Ser. No. 09/033,022, which is assigned to the assignee of the present application and is incorporated herein by reference.

One embodiment of a positive displacement dispensing pump 100 of the present invention will now be described with reference to FIGS. 2–7. The dispensing pump 100 described below has three pistons that move within three cylinders to draw material into the cylinders and cause material to be dispensed from the cylinders. As understood by those skilled in the art, the present invention is not limited to three cylinder pumps, but rather, the features described below for the dispensing pump 100 may be implemented in pumps having more or less than three pistons and cylinders.

Figure 2:
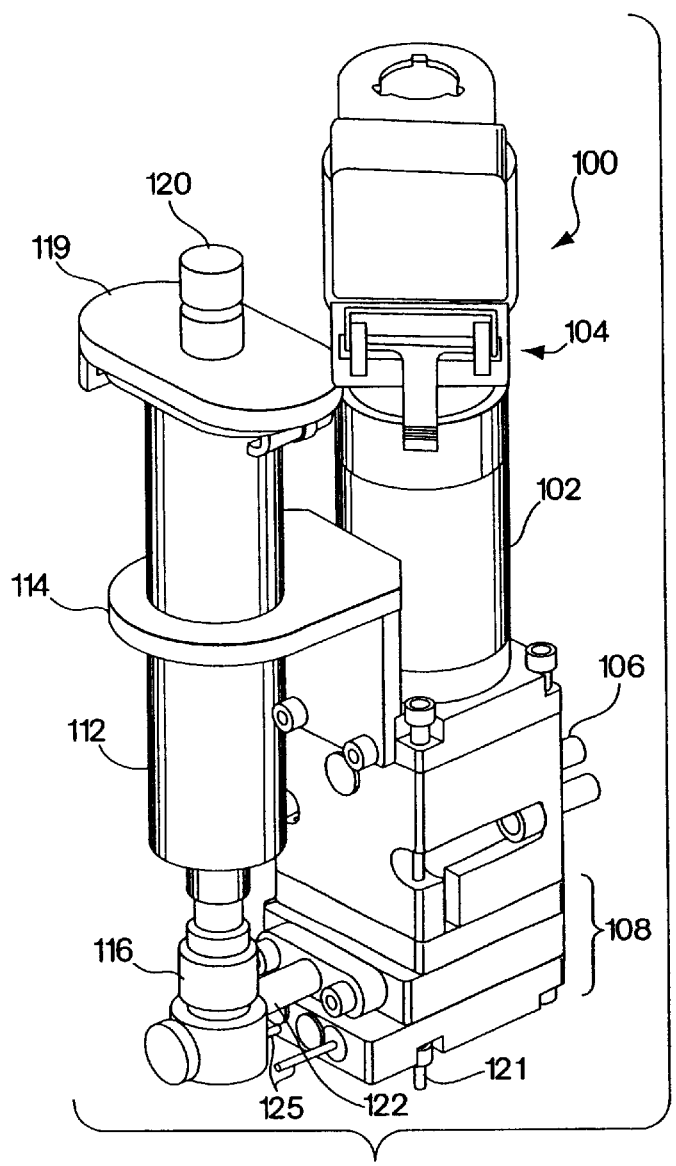
FIG. 2 is a perspective view of a dispensing pump in accordance with one embodiment of the present invention.
Figure 2A:
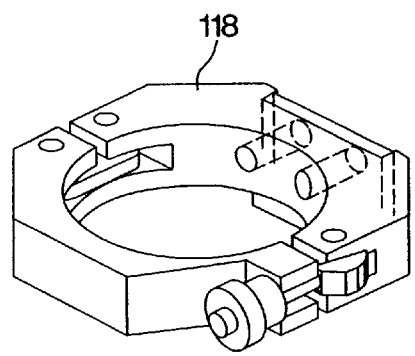
FIG. 2A is a perspective view of a bracket used to couple the dispensing pump of FIG. 2 to a dispensing system.

The positive displacement dispensing pump 100 includes a servo motor 102, an encoder 104, a cylinder housing 106, a distribution block 108, a syringe 112, a syringe bracket 114, a syringe block 116, and a dispensing needle 121. The dispensing pump 100 may be mounted to a dispensing system using a bracket 118 (shown in FIG. 2A) that couples to the motor 102. The dispensing pump provides controlled dispensing of material contained in the syringe 112 out of the needle 121 onto a substrate.

The encoder 104 is designed to couple with a computer control system of a dispensing system to coordinate transfer of control signals between the control system and the servo motor 102 of the dispensing pump. The servo motor 102 may be implemented using one of a number of known motors. The servo motor is the primary drive motor of the dispensing pump 100 and controls movement of cylinders contained within the cylinder housing 106. In one embodiment, the servo motor is implemented using Model No. 3042 available from Micro-Mo Electronics of Clearwater, Fla.

In one embodiment of the present invention, the encoder is implemented using Model No. HEDS-5540 available from Hewlett Packard Corporation. In this embodiment, the encoder has 630,000 encoder positions for 360 degrees of rotation of the pump. The encoder controls the position of the motor by moving the motor a fixed number of encoder positions in response to signals from a motor controller contained within the computer control system.

The syringe 112 contains material to be dispensed by the dispensing pump. The syringe is held in place using the syringe bracket 114 and syringe block 116. The syringe has a cap 119 that has a pressurized air inlet 120 for coupling to a pressurized air source to apply pressure to the material in the syringe. The syringe block 116 includes a material feed tube 122 to provide material flow between the syringe and the inlet of the distribution block. In one embodiment, the syringe block may contain heating elements to control the temperature of material being dispensed. In addition, the distribution block may include cartridge heaters 125 for heating the material prior to dispensing. For many applications, it is desirable to control the temperature of the dispensing material to provide a consistent viscosity to improve the dispensing accuracy of the pump.

Figure 3:
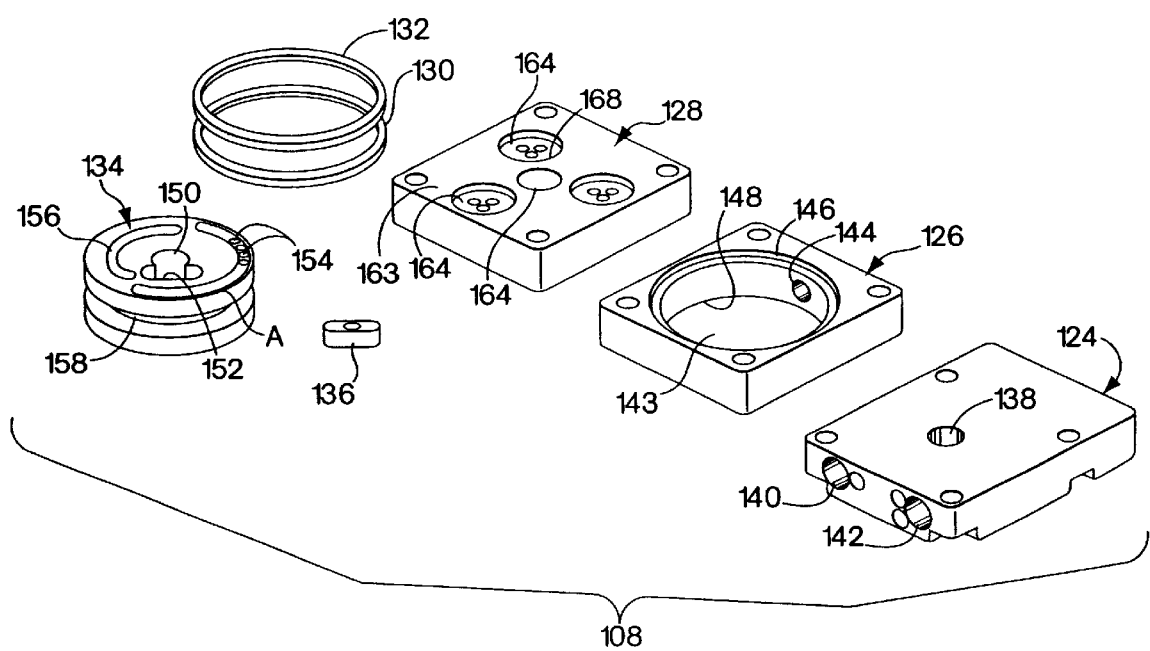
FIG. 3 is an exploded view of a distribution block of the dispensing pump of FIG. 2.
Figure 4:
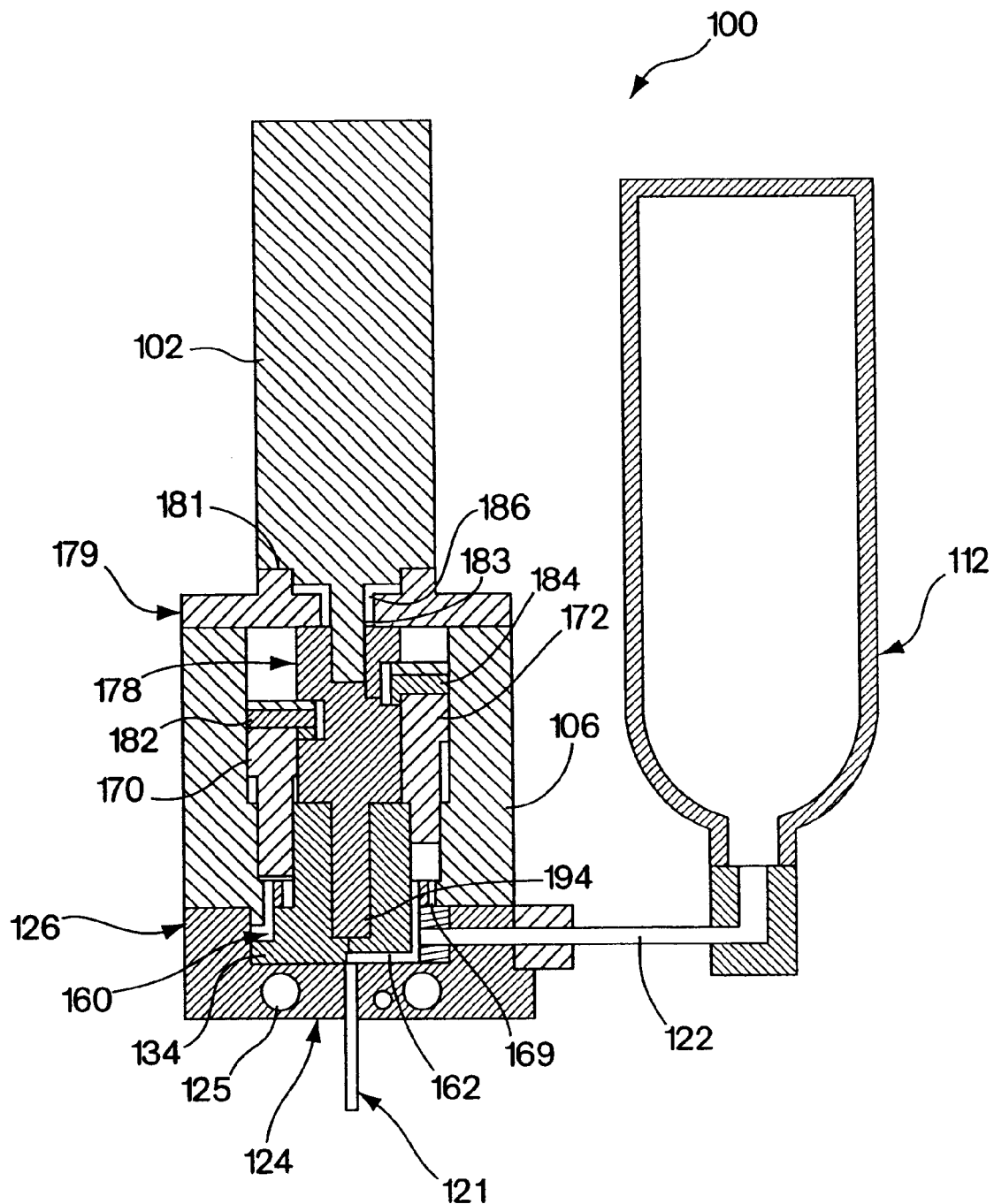
FIG. 4 is a first cross-sectional view of the dispensing pump of FIG. 2.

The distribution block 108 will now be further described with reference to FIG. 3, which shows an exploded view of the distribution block 108, and with reference to FIG. 4 which shows a cross-sectional view of the dispensing pump 100. The dispensing block includes a needle mating plate 124, a valve spacer plate 126, a cylinder base plate 128, a lower gasket 130, an upper gasket 132, a disk valve 134 and a key 136. The needle mating plate 124 includes a through hole 138 into which the needle 121 is mounted, and the needle mating plate also includes two cylindrical channels 140 and 142 for receiving the cartridge heaters 125.

The valve spacer plate 126 mounts on top of the needle mating plate 124. The valve spacer plate has a circular opening 143, a channel 144 and two annular grooves 146 and 148. The circular opening 143 is for receiving the disk valve 134. The channel 144 is for passing dispensing material from the material feed tube 122 to the disk valve 134. The lower gasket 130 and the upper gasket 132 fit into respectively annular grooves 146 and 148 to provide a seal between the disk valve and the valve spacer. In one embodiment, the lower gasket and the upper gasket are made from ethylene polypropylene to provide compatibility with commonly used cleaning solutions.

The disk valve 134 includes a center circular hole 150, a substantially oval shaped hole 152, inlet holes 154, outlet holes 156, an annular groove 158, an inlet passage 160 and an outlet passage 162. The inlet passage and the outlet passage are shown in FIG. 4. The circular hole 150 extends approximately half way through the disk valve and receives an end 194 of the drive cam 178. The oval shaped hole 152 receives the key 136, which secures the drive cam in the hole 150 to provide rotational alignment between the drive cam and the disk valve and to allow the disk valve to rotate with the drive cam. The inlet holes 154 are coupled to the annular groove 158 to allow dispensing material to flow from the syringe through the channel 144 of the valve spacer 126 into the annular groove 158 and through the inlet holes 154. The outlet holes 156 are coupled to the outlet passage 160. The outlet passage has an opening on the center of the bottom surface of the disk valve that couples to the dispensing needle. Dispensing material flows from the cylinders, as will be described below, through the outlet holes and through the outlet passage to the dispensing needle.

The cylinder base plate 128 has a substantially smooth bottom surface that mates with the top surface of the valve spacer plate 126. The top surface 163 of the cylinder base plate has three circular indentations that form the cylinder base 164 for each of the cylinders of the dispensing pump 100. The cylinder base plate also includes a cylindrical channel 166 that allows the end of the drive cam to pass through the cylinder base plate 128 to mate with the disk valve 134. Each of the cylinder bases has two inlet holes 169 and one outlet hole 168. In other embodiments of the present invention, the two inlet holes may be joined to form an inlet slot. The inlet holes 169 align with the inlet holes 154 of the disk valve during rotation of the disk valve to allow material to flow into the cylinder. The outlet hole 168 aligns with the outlet holes 156 of the disk valve to allow material to flow from the cylinder through the outlet holes 156. In other embodiments of the present invention, each of the cylinder base plates may be constructed with only one hole that functions as both an inlet hole and an outlet hole.

Figure 5:
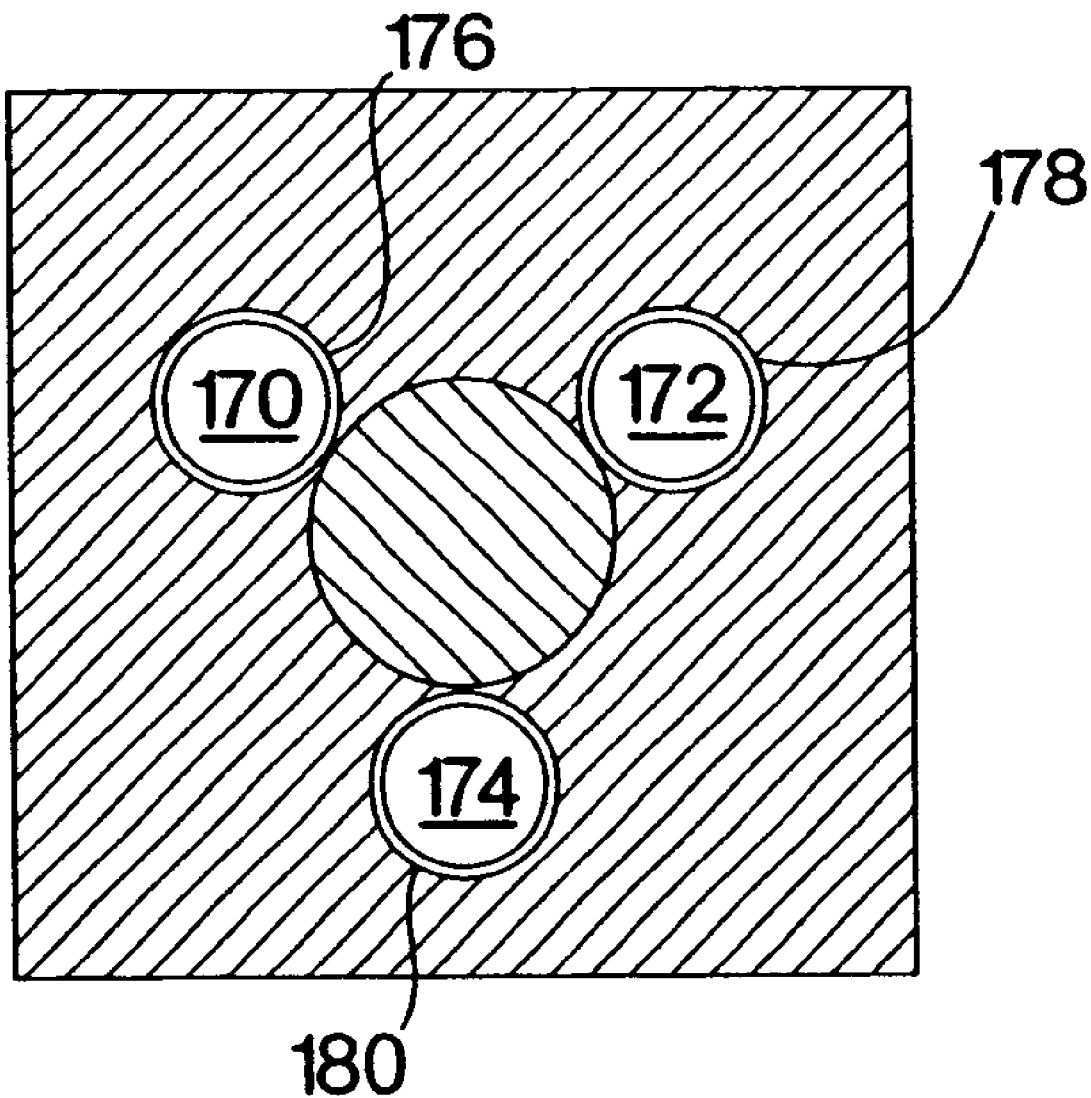
FIG. 5 is a second cross-sectional view of the dispensing pump of FIG. 2.

The cylinder housing will now be described in greater detail with reference to FIGS. 4 and 5 which show cross-sectional views of the cylinder housing. The cylinder housing includes three pistons 170, 172 and 174 each disposed in a cylinder 176, 178 and 180. At the top of each of the pistons is a cam follower. Only two of the cam followers 182 and 184 can be seen in the view shown in FIG. 4. The cylinder housing also includes a drive cam 178 and a motor mating plate 179. The motor mating plate provides a surface 181 on which the motor 102 mounts, and the motor mating plate provides an opening 183 through which the drive shaft 186 of the motor extends.

Figure 6:
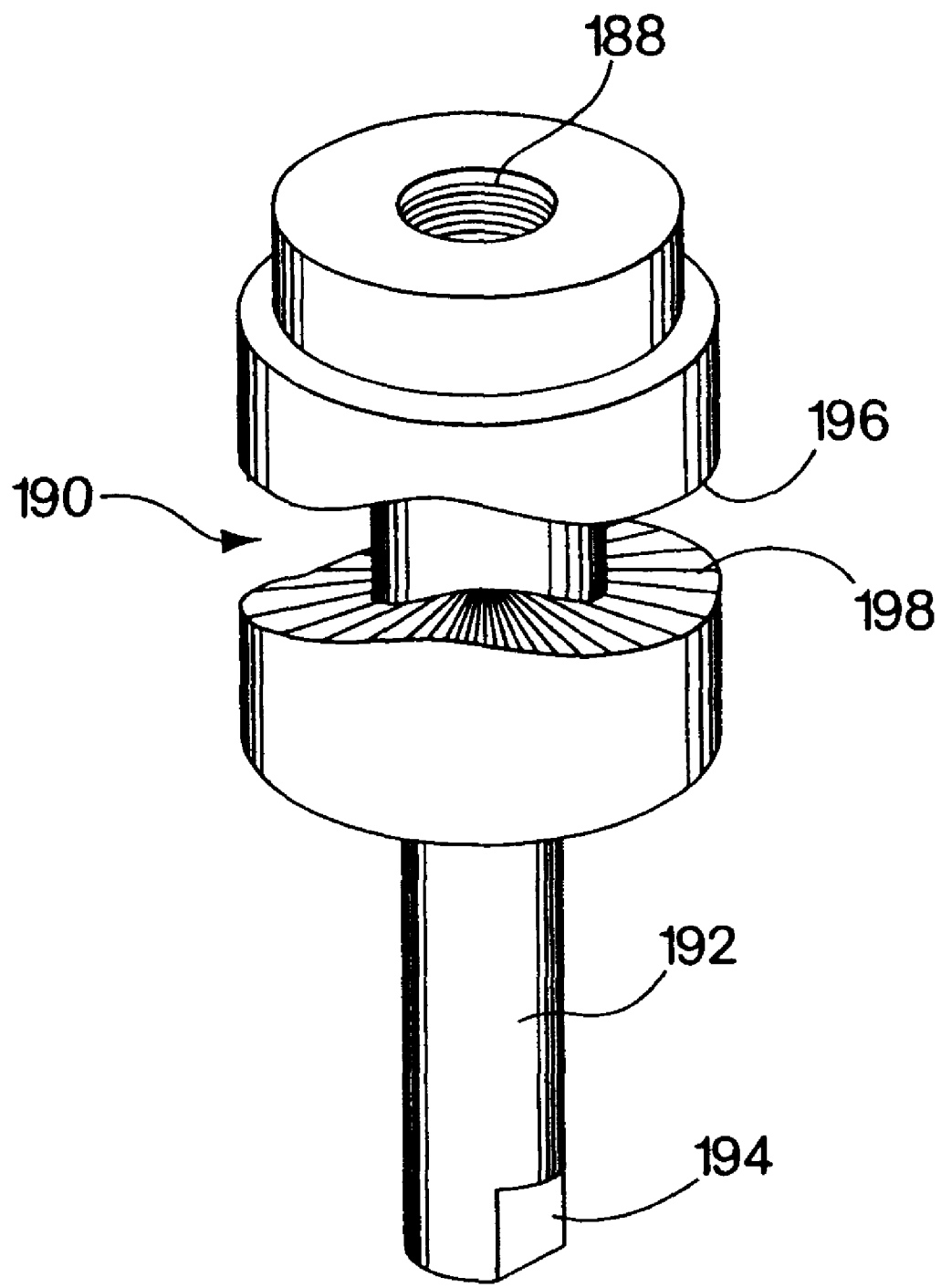
FIG. 6 is a perspective view of a drive cam used in the dispensing pump of FIG. 2.

The drive cam 178 is shown in greater detail in FIG. 6. The drive cam has a threaded cylindrical channel 188, an annular groove 190, and a shaft 192. The cylindrical channel 188 receives the drive shaft 186 to provide rotation of the drive cam 178 by the motor. The shaft 192 extends through the cylinder housing and into the disk valve 134. The end 194 of the shaft is designed to mate with the key 136. The rotation of the drive cam causes the disk valve 134 to rotate so that at the appropriate times, the inlet holes 154 and the outlet holes 156 of the disk valve are aligned respectively with the inlet holes 169 and the outlet hole 168 of one of the cylinder bases 164 of the cylinder base plate. In one embodiment of the present invention, the drive cam, and thus, the disk valve is rotated in a counterclockwise direction when viewed from the top of the dispensing pump looking down. However, in other embodiments, pumps may be designed having clockwise rotation.

The annular groove 190 has an upper surface 196 and a matching lower surface 198. The cam followers reside in the annular groove between the upper surface and the lower surface. The upper surface and the lower surface of the annular groove are contoured to provide raising and lowering of the cam followers in the annular groove as the drive cam is rotated by the motor. The movement of the cam followers in the annular groove causes the pistons to be raised and lowered to draw material into the pump and dispense material from the pump. In one embodiment of the present invention, the annular groove is designed to provide a 0.250 inch stroke for the piston, such that the piston moves 0.250 inches from its retracted position to its extended position. In addition, the annular groove has flat sections that result in dwell periods of the pistons. The dwell periods are timed to coincide with the opening and closing of the valves of the disk valve to prevent vertical movement of the pistons while the valves are opened and closed.

Each of the pistons is substantially identical and is coupled to one of the cam followers. In one embodiment, the pistons are made from stainless steel and are press fit to the cam followers. In one embodiment, the cam followers include ball bearings. In FIG. 4, one of the pistons 170 is shown in the fully extended position, and one of the pistons 172 is shown in the fully retracted position. In one embodiment, the ends of the pistons are made using removable washers and the bodies of the cylinders are made from glass. In this embodiment, both the bottoms of the pistons and the bottoms of the cylinder are removable when the distribution block is removed from the cylinder housing. The bottoms of the cylinders and the bottoms of the pistons are the only components within the cylinder housing to contact the dispensing material, and the ease with which they can be removed simplifies the cleaning process for the dispensing pump 100.

Figure 7:
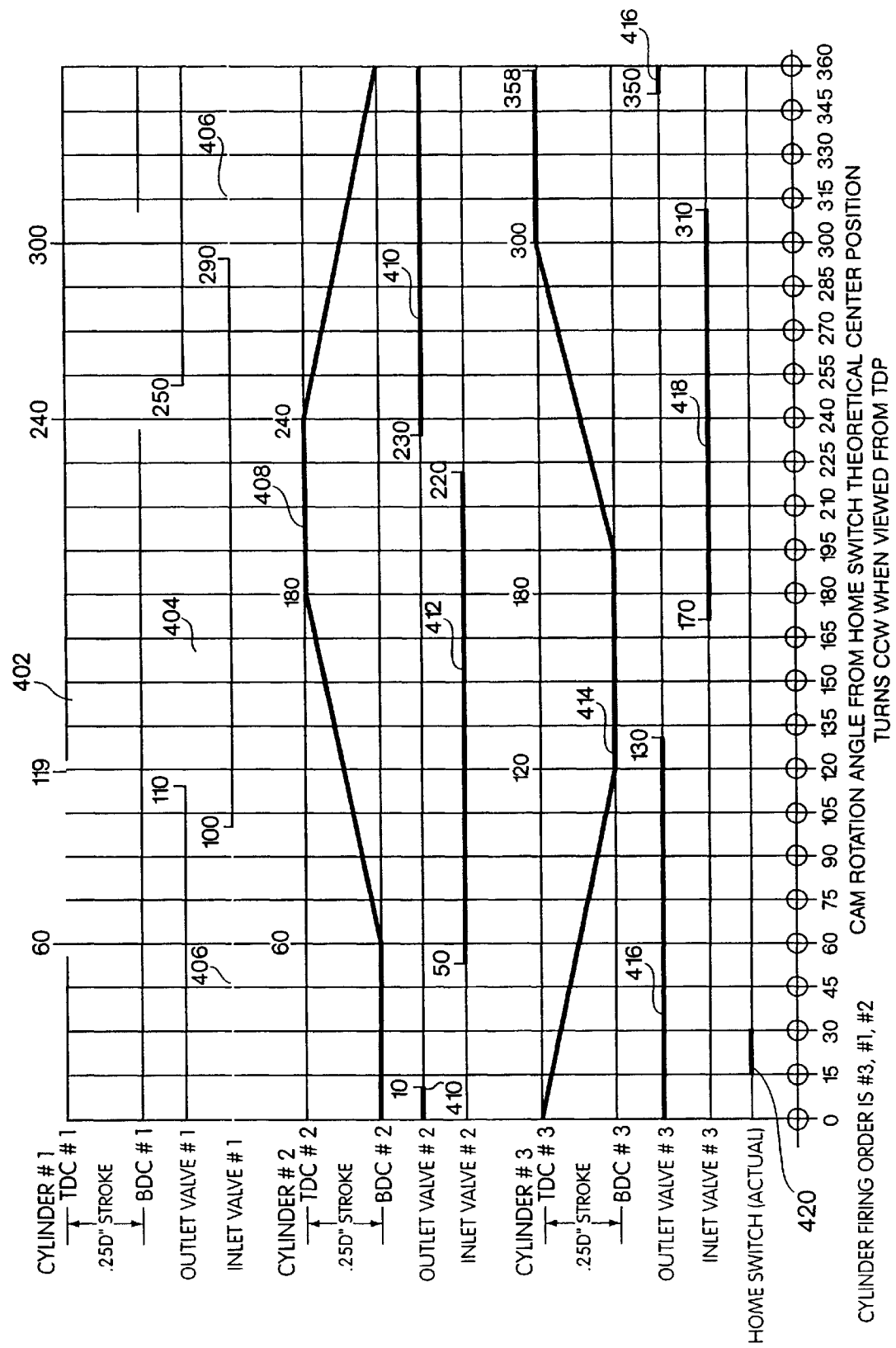
FIG. 7 is a timing diagram for the operation of the dispensing pump of FIG. 2.

The operation of the dispensing pump to dispense material will now be described. At the start of dispensing, air pressure is provided to the material in the syringe through the air inlet 120. In one embodiment, the air pressure is set for approximately 300 psi. FIG. 7 provides a timing diagram showing the relative positions of the three pistons and the disk valve for one complete 360 degree 1. rotation of the drive cam. Cylinders 1, 2 and 3 in FIG. 7 correspond to cylinders 176, 178 and 180 (see, FIG. 5). In FIG. 7, curves 402, 408 and 414 respectively show the positions of pistons 170, 172 and 174 for one 360 degree rotation of the drive cam.

In the timing diagram of FIG. 7, for each of the cylinders, curves are provided that show when an outlet valve and an inlet valve are in an "OPEN" position. The inlet valves and the outlet valves are formed by the combination of the inlet holes and the outlet holes of the cylinder bases and the inlet holes and the outlet holes of the disk valve. For each cylinder, the inlet valve is "OPEN" when its inlet hole 168 aligns with the inlet holes 156 of the disk valve, and the outlet valve is "OPEN" when the outlet holes 169 align with the outlet holes 154 of the disk valve. Curve 404 and curve 406 respectively indicates when the outlet valve and the inlet valve for cylinder 176 is "OPEN," curves 410 and 412 respectively indicates when the outlet valve and the inlet valve for cylinder 178 is "OPEN," and curves 416 and 418 respectively indicates when the outlet valve and the inlet valve for cylinder 180 is "OPEN,". The position of a home switch used in a second embodiment of the present invention described below is shown by curve 420 in FIG. 7.

The positioning of piston 170 in cylinder 176 (cylinder 1 of FIG. 7) and the timing of the opening and closing of the valves for piston 170 will now be described for one 360 degree dispensing cycle. As discussed above, curve 402 shows the positioning of piston 170. At the zero degree position in FIG. 7, piston 170 is at the midpoint of a retraction stroke and the valve for cylinder 176 is in the "OPEN" position allowing dispensing material to flow into the cylinder 176 as the piston 170 is retracted. At the zero degree position, the point marked "A" on disk valve 154 (see, FIG. 3) is aligned with the inlet holes of cylinder 176.

The piston 170 continues to retract for the next sixty degrees at which point it reaches the fully retracted position. The piston 170 remains in the retracted position for a first dwell time that lasts for 59 degrees of rotation of the drive cam. The inlet valve is turned to the "OFF" position at the 100 degree point during the first dwell time. The outlet valve is turned to the "OPEN" position at the 110 degree point, also during the first dwell time. In embodiments of the present invention, the valves are always turned on and off during dwell periods when the pistons are not moving and there is no material flow through the valves. This allows for smoother transitions between cylinders to provide continuous dispensing.

Piston 170 begins an extension stroke at the 120 degree point to begin dispensing material from cylinder 176. The extension stroke continues until the 240 degree point. At the 240 degree point, the piston is in its fully extended position and remains in the fully extended position for a second dwell time that lasts for 60 degrees. The outlet valve stays on for the duration of the extension stroke and for an additional ten degrees after completion of the extension stroke. The inlet valve turns on at the 290 degree point during the second dwell time of the piston. At 300 degrees, piston 170 begins a retraction stroke that continues until the end of the 360 degree cycle and continues for the first 60 degrees of the next cycle.

As shown in FIG. 7, each of the other pistons 172 and 174 in the dispensing pump operates using a dispensing cycle identical to that described for piston 170 above, except that pistons 172 and 174 are 120 degrees out of phase with piston 170.

In one embodiment of the present invention, approximately 1 gram of material is dispensed for each revolution of the drive cam and the dispensing pump is operated at rotational speeds between 5 and 20 rpm.

Figure 8:
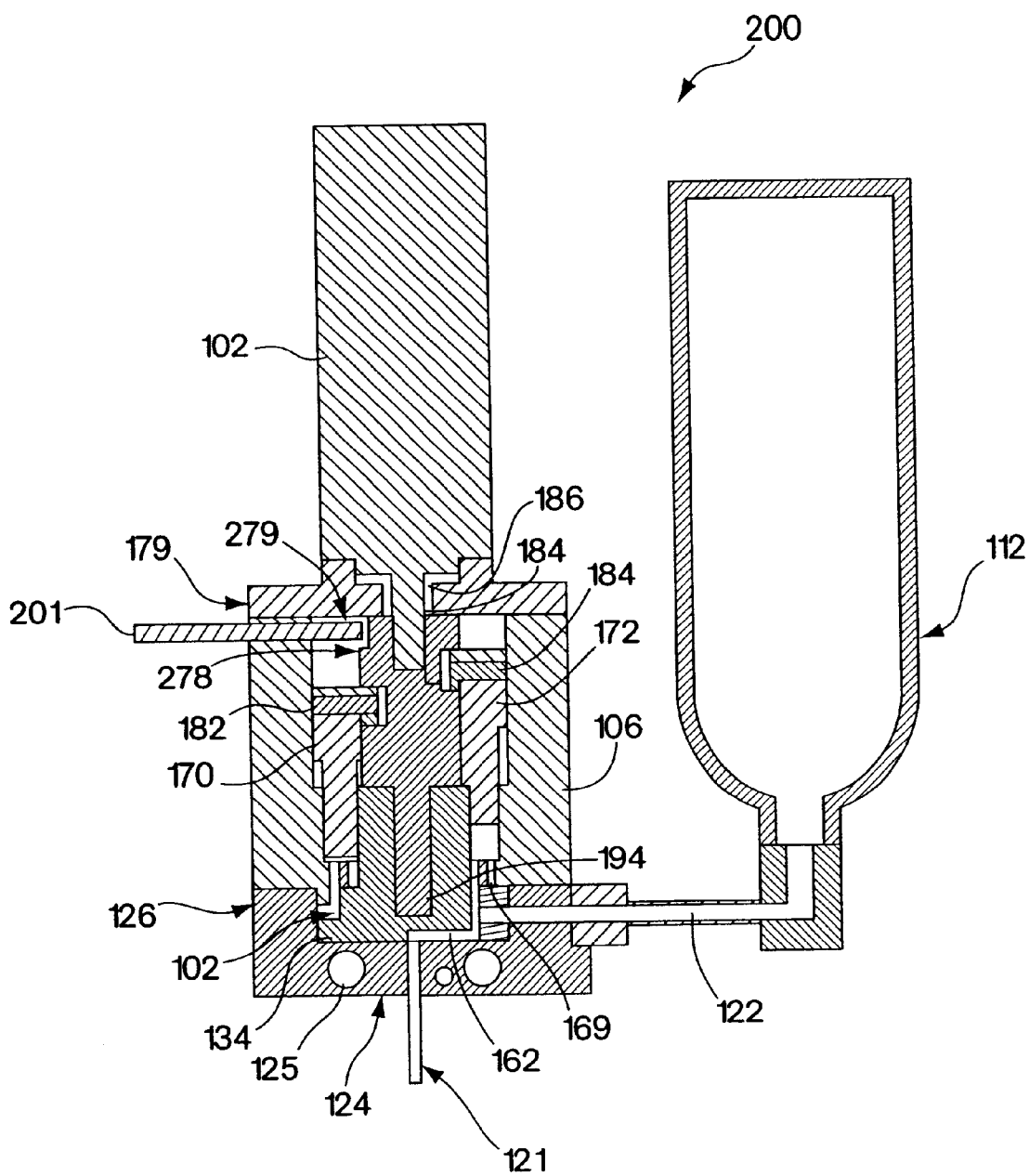
FIG. 8 is a cross-sectional view of a dispensing pump in accordance with a second embodiment of the present invention.

A second embodiment of a dispensing pump 200 of the present invention will now be described further with reference to FIG. 8, which provides a cross-sectional view of the dispensing pump 200. The dispensing pump 200 is similar in many aspects to dispensing pump 100, and similar components have been labeled using the same reference numbers. Dispensing pump 200 differs from dispensing pump 100 in that a home switch 201 is added and the drive cam 278 is modified to add a sensing notch 279. The home switch is designed to be coupled to the computer control system of a dispensing system and is used to detect a predefined home position of the drive cam. In one embodiment of the present invention, the home switch 201 is implemented using a Hall Effect proximity sensor, such as Model No. BI0.8-AN6X available from Turck Controls, and the sensing notch 279 of the drive cam includes a notch in the drive cam that extends for 15 degrees. The timing diagram of FIG. 7, includes a curve 420 that shows the rotational period during which the home switch is aligned with the notch of the drive cam. The actual home position is defined as the leading edge of the notch, which occurs at 22.5 degrees in the timing diagram of FIG. 7.

As will now be described, the home switch in the dispensing pump 200 may be used as part of a calibration and control method of the present invention to improve the accuracy of the volume of material dispensed from a dispensing system containing the dispensing pump 200. Ideally, the weight of material dispensed from the dispensing pumps of the present invention should be linear with the rotational position of the motor and the drive cam, such that a given degree of motor rotation results in a constant weight of material being dispensed regardless of drive cam position. In addition, it is desirable to dispense at a constant dispense rate, particularly for dispensing applications like flip chip underfill, during which it is desirable to dispense a consistent bead of material around the perimeter of a flip chip. It has been found that due to a number of factors including for example, dimensional tolerances, the dispensing pumps of the present invention may not always perform in this ideal linear manner, particularly when small quantities of material are being dispensed.

To correct for non-linearities in the dispensing pumps, a calibration and control method is used by dispensing systems of the present invention. In one embodiment of a calibration and control method of the present invention, the weight of material dispensed at a predetermined number of equidistant rotational starting points is determined for a fixed angular displacement of the drive cam. Based on the weight of material measured, correction values are calculated and used during actual dispensing to improve the accuracy of the weight of material dispensed.

Figure 9:
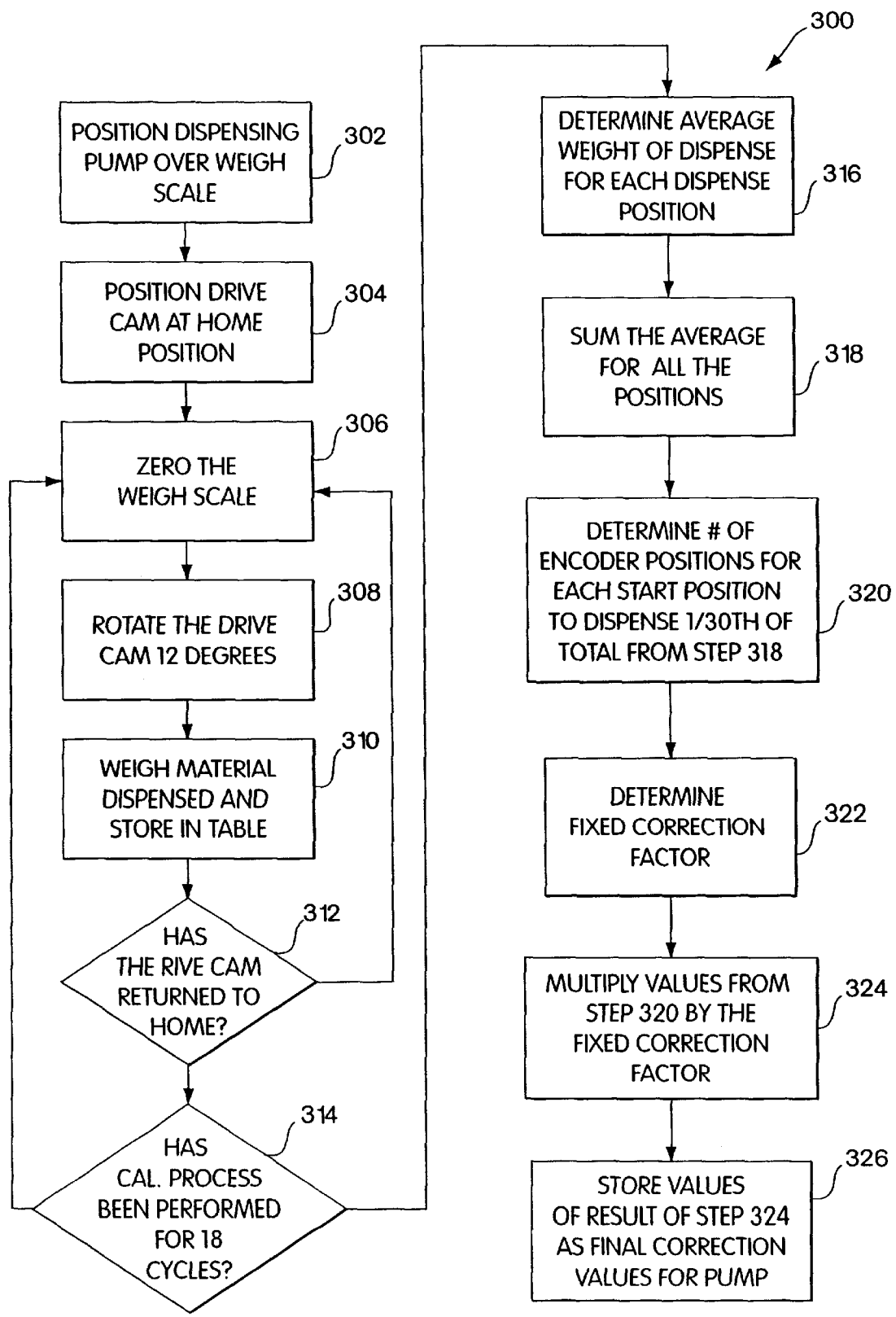
FIG. 9 is a flow chart of a calibration scheme of the present invention used with the second embodiment of the present invention.

A method 300 for determining correction factors used in the calibration and control method will now be described in greater detail with reference to FIG. 9. In a first step 302 of the method, the dispensing pump is positioned over an electronic weigh scale. Next, in steps 304 to 310, the drive cam is moved to the home position, the weigh scale is zeroed, the drive cam is rotated 12 degrees to dispense material onto the weigh scale, and the dispensed material is weighed and stored in a controller coupled to the dispensing pump. At step 312, a determination is made whether the drive cam has returned to home position. If the outcome of step 312 is "No", then the method returns to step 306.

If the outcome of step 312 is "Yes", which outcome will occur after 30 measurements have been performed, then the process proceeds to step 314. In step 314, a determination is made as to whether calibration measurements have been performed for 18 cycles of the drive cam. If the outcome of step 314 is "No", then the process returns to step 306. If the outcome of step 314 is "Yes", then the process proceeds to step 316. After step 314, the table in the controller contains data at 30 different rotational positions for 18 different revolutions of the drive cam. As understood by those skilled in the art, rather than using 30 dispenses of 12 degrees each, other values may be used in the calibration cycle, however, it is desirable to use starting points at equidistant points around the drive cam, and it is desirable that the rotational distance between points correspond to an integer number of encoder points. In other embodiments of the present invention, more or less than 18 different revolutions of the drive cam may be used.

After all of the data in the table has been gathered, then in step 316 the controller of the dispensing system determines an average weight of material dispensed for each of the thirty starting positions by summing the dispensed weights for each position and dividing the sum by 18. Next, in step 318, the averages at each starting position are added together to obtain an average weight of material dispensed for a full revolution of the drive shaft. Next, in step 320, for each of the starting positions, the number of encoder positions that the motor must be moved to dispense $\frac{1}{30}^{th}$ of the average total for a full revolution is determined using equation (1) below:

$$\text{Enc}(I)=((\text{avgall}/\text{avg}(I))*(\text{Encoder}/30)) \quad \text{(equation 1)}$$

Where: Enc(I)=the number of encoder positions at position I (I=1 to 30);

avgall=the average dispensed weight for a full revolution of the drive can;

avg(I)=the average dispensed weight for 12 degrees of rotation starting at position I;

Encoder=the total number of encoder positions of the motor for 360 degrees.

In step 322 of the method 300, each of the 30 encoder counts Enc(I) are summed and the reciprocal of this sum is multiplied by the total number of encoder positions (Encoder) to obtain a fixed correction factor. In most instances, the fixed correction factor will be approximately equal to 1, and the use of the fixed correction factor is optional and not required in embodiments of the present invention. In step 324, each of the encoder values Enc(I) are multiplied by the fixed correction factor.

In step 326, the final correction values CV(I) for each of the thirty positions are stored in a table in the controller and/or printed. The correction values obtained in method 300 are unique values for the particular dispensing pump that was used during the calibration process, and may be stored along with a serial number or identification number of the dispensing pump for identification purposes.

In one embodiment of a dispensing system of the present invention, a PMAC controller, such as those available from Delta Tau Controls is used as the controller in the computer system for controlling the motor of the dispensing pump 100. The PMAC controller has the capability to receive correction factors for motors controlled by the controller to provide true linear operation of the motors. For embodiments of the present invention that utilize the PMAC controller, an additional conversion is performed to format the correction factors obtained in process 300 for the PMAC controller. The conversion is performed using two additional steps. In a first of the additional steps, the correction values CV(I) (for I=1 to 30) obtained in process 30 are converted to relative correction values using equation (2) below.

$$CV(I)_{rel} = CV(I-1)_{rel} + CV(I) \quad \text{(Equation 2)}$$

Where: $CV(I)_{rel}$ is the relative correction value at point I;
$CV(I-1)_{rel}$ is the relative correction value at point I-1;
$CV(I)$ is the correction value at point I.

Equation 3 is then used to convert the relative correction values $CV(I)_{rel}$, obtained in equation 2 into correction values in the proper format for the PMAC controller.

$$CV(I)_{pmac} = (CV(I)_{rel} - (I*ENCDR/30)*K \quad \text{(Equation 3)}$$

Where: $CV(I)_{pmac}$ is the PMAC correction factor at point I;
$CV(I)_{rel}$, is the value from equation 2;
I is the index value from 1 to 30;
ENCDR is the number of encoder points in 360 degrees;
K is a constant of the controller and for the PMAC controller is equal to (−16).

After the correction values are obtained in equation 3, they are converted to their integer values and stored in the PMAC controller. In one embodiment of the present invention, when the absolute value of a correction value is less than a small value, such as two, then the correction value is set equal to zero. The PMAC controller uses the correction factors during dispensing to provide linear dispensing. In the embodiment described above, correction factors are calculated at 30 rotational positions. In embodiments of the invention, the controller extrapolates the correction factors to obtain correction factors at positions between the 30 rotational positions to provide linear dispensing independent of the starting and stopping position of the drive cam.

The procedure provided above converts the correction factors obtained in process 300 for use with a PMAC controller. Embodiments of the present invention may be implemented using other controllers, and as understood by those skilled in the art, other, or additional steps may be taken to convert the correction factors for use with other controllers.

In one embodiment of the present invention, the serial number or identification number of the dispensing pumps are electronically readable by dispensing systems using one of a number of technologies, including bar code technologies, smart chip technologies or similar technologies. Upon identification of a dispensing pump, a dispensing system may locate and read the appropriate correction factors from memory. In other embodiments of the present invention, the correction factors may be stored in a smart chip or some similar device mounted on the dispensing pump and readable by dispensing systems.

During dispensing by the dispensing system, the correction values determined above are used to adjust the number of encoder positions that the motor is rotated to obtain a desired weight of dispensed material based on the starting position of the drive cam. In one embodiment, the position of the drive cam is monitored by the controller by detecting the home position at each revolution and monitoring the encoder count since the time the home position was detected.

In the dispensing pumps described above, the use of a drive cam having flat surfaces to produce dwell times in which the pistons remain stationary provides improved performance of the dispensing pumps. The use of the dwell times provides gradual transition between the cylinders both in discharging material from the cylinders and in recharging the cylinders with material.

In embodiments of the present invention described above, pistons are used within dispensing chambers to draw material into and dispense material from the dispensing chambers. As understood by those skilled in the art, in other embodiments devices other than pistons may be used to dispense material from the dispensing chambers. These other devices may include an expandable bellows or an expandable bladder. In still other embodiments, the dispensing chambers may be coupled to compressed air sources and/or vacuum pumps that create pressure changes to cause material to flow into and be dispensed from the dispensing chambers. In addition, in embodiments described above, separate inlet holes and outlet holes are provided for each of the cylinder bases. In other embodiments of the present invention, the same hole or holes may be used to provide material to the cylinders and to dispense material from the cylinders.

Dispensing pumps of the present invention are simpler to manufacture and simpler to clean than prior art dispensing pumps. As shown in FIG. 3, the distribution block of dispensing pumps is easily dismantled to allow cleaning of all surfaces that contact the dispensing material. In addition, the cylinders and portions of the pistons that contact the dispensing material are removable for cleaning through the bottom of the cylinder housing when the distribution block is removed.

Dispensing pumps of embodiments of the present invention have several advantages over prior art dispensing pumps. These advantages include: the ability to simultaneously refill alternate chambers while dispensing from another chamber; the ability to meter the desired volume of dispensed material based solely upon the number of degrees of input shaft rotation; the ability to dispense accurate volumes at rapid cycle rates due to the elimination of wait times for pump refill. In addition, the minimum of individual parts used to construct pumps along with the simplicity of assembly makes cleaning of the pump components quick and easy. Further, the use of a calibration system in embodiments of the present invention removes inconsistencies that may be due to manufacturing tolerances. This results in high accuracy in the volume of material dispensed.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A method of dispensing viscous material onto a substrate using a dispensing system having a dispensing pump, the dispensing pump having at least three dispensing chambers each having a piston movable within the dispensing chamber to draw the viscous material into the dispensing chamber and to dispense the viscous material from the dispensing chamber, the method comprising steps of:

loading the substrate into the dispensing system;

positioning the dispensing pump over the substrate;

moving one of the pistons in one of the dispensing chambers in a first direction for a first predetermined movement time to a retracted position to draw viscous material into the one of the dispensing chambers;

maintaining the one of the pistons at the retracted position for a first predetermined dwell time;

moving the one of the pistons in a second direction, opposite the first direction, for a second predetermined movement time to an extended position to dispense the viscous material from the one of the dispensing chambers, wherein the second predetermined movement time is substantially the same as the first predetermined movement time.

2. The method of claim 1, wherein the dispensing pump further includes an inlet to receive material, an outlet from which material is dispensed, and a valve controllable between a first open position and a first closed position, such that in the first open position, the valve operatively couples the inlet to the one of the dispensing chambers to enable material to flow from the inlet to the one of the dispensing chambers, and in the first closed position the valve prevents material flow from the inlet to the one of the dispensing chambers, and wherein the method further includes a step of moving the valve from the first open position to the first closed position at a first predetermined switch time after the one of the pistons has reached the retracted position and during the first predetermined dwell time.

3. The method of claim 2, wherein the method further includes steps of:

maintaining the one of the pistons at the extended position for a second predetermined dwell time;

moving the piston in the first direction to draw viscous material into the one of the dispensing chambers.

4. The method of claim 3, wherein the valve is controllable between a second open position and a second closed position such that in the second open position, the valve operatively couples the one of the dispensing chambers to the outlet to enable material to flow from the one of the dispensing chambers to the outlet, and in the second closed position the valve prevents material flow from the one of the dispensing chambers to the outlet, and wherein the method further includes a step of moving the valve from the second open position to the second closed position at a second predetermined switch time after the one of the position has reached the extended position and during the second predetermined dwell time.

5. The method of claim 4, further comprising steps of:

moving the valve from the first closed position to the first open position during the second predetermined dwell time; and moving the valve from the second closed position to the second open position during the first predetermined dwell time.

6. The method of claim 4, wherein the second predetermined switch time is ten degrees.

7. The method of claim 2, wherein the first predetermined switch time is ten degrees.

8. The method of claim 1, further comprising the step of moving a second one of the pistons in a second one of the dispensing chambers in a direction to dispense the viscous material from the second one of the dispensing chambers during at least a portion of the second predetermined movement time.

9. A method of dispensing viscous material onto a substrate using a dispensing system having a dispensing pump, the dispensing pump having at least three dispensing chambers each having a piston movable within the dispensing chamber to draw the viscous material into the dispensing chamber and to dispense the viscous material from the dispensing chamber, an inlet to receive material, an outlet from which material is dispensed, and a valve controllable between a first open position and a first closed position, such that in the first open position, the valve operatively couples the inlet to the one of the dispensing chambers to enable material to flow from the inlet to the one of the dispensing chambers, and in the first closed position the valve prevents material flow from the inlet to the one of the dispensing chambers, the method comprising steps of:

loading the substrate into the dispensing system;

positioning the dispensing pump over the substrate;

moving one of the pistons in one of the dispensing chambers in a first direction for a first predetermined movement time to a retracted position to draw viscous material into the one of the dispensing chambers;

maintaining the one of the pistons at the retracted position for a first predetermined dwell time; and moving the valve from the first open position to the first closed position at a first predetermined switch time after the one of the pistons has reached the retracted position and during the first predetermined dwell time, wherein the valve is controllable between a second open position and a second closed position such that in the second open position, the valve operatively couples the one of the dispensing chambers to the outlet to enable material to flow from the one of the dispensing chambers to the outlet, and in the second closed position the valve prevents material flow from the one of the dispensing chambers to the outlet, the method farther comprising the steps of:

moving the one of the pistons in a second direction, opposite the first direction, for a second predetermined movement time to an extended position to dispense the viscous material from the one of the dispensing chambers;

maintaining the one of the pistons at the extended position for a se pond predetermined dwell time; and moving the valve from the second open position to the second closed position at a second predetermined switch time after the one of the pistons has reached the extended position and during the second predetermined dwell time.

10. The method of claim 9, further comprising steps of:

moving the valve from the first closed position to the first open position during the second predetermined dwell time; and moving the valve from the second closed position to the second open position during the first predetermined dwell time.

* * * * *